US007388787B2

(12) United States Patent
Portmann et al.

(10) Patent No.: US 7,388,787 B2
(45) Date of Patent: Jun. 17, 2008

(54) REFERENCE CURRENT GENERATOR

(75) Inventors: Lionel Portmann, Lausanne (CH); Tse-Chi Lin, Yunghe (TW)

(73) Assignee: Elan Microelectronics Corporation, Hsinchu (TW)

( * ) Notice: Subject to any disclaimer, the term of this patent is extended or adjusted under 35 U.S.C. 154(b) by 314 days.

(21) Appl. No.: 11/370,059

(22) Filed: Mar. 8, 2006

(65) Prior Publication Data

US 2007/0019487 A1 Jan. 25, 2007

(30) Foreign Application Priority Data

Jul. 22, 2005 (TW) .............................. 94124965 A

(51) Int. Cl.
*G11C 11/03* (2006.01)

(52) U.S. Cl. ........................... 365/185.21; 365/185.18; 365/205; 365/207; 365/208

(58) Field of Classification Search ........... 365/185.21, 365/185.18, 205, 207, 208
See application file for complete search history.

(56) References Cited

U.S. PATENT DOCUMENTS 6,707,715 B2 * 3/2004 Michael et al. ........ 365/185.18
6,999,365 B2 * 2/2006 Takano et al. .............. 365/207

* cited by examiner

*Primary Examiner*—Pho M. Luu
(74) *Attorney, Agent, or Firm*—Rosenberg, Klein & Lee

(57) ABSTRACT

In a reference current generator, a current mirror has a referent branch with a first current flowing thereon and a mirror branch to produce a second current by mirroring the first current, a first transistor is coupled to the referent branch, a second transistor is coupled to the mirror branch and has a gate coupled to the gate of the first transistor, one or more third transistors each produces a reference current by mirroring the first current or the second current to supply for a load, and a resistor having a resistance proportional to the absolute temperature is coupled to the first transistor such that a third current equal to the summation of the first current and all the mirrored reference currents flows through the resistor.

3 Claims, 4 Drawing Sheets

REFERENCE CURRENT GENERATOR

FIELD OF THE INVENTION

The present invention is related generally to a reference current generator and, more particularly, to a reference current generator having smaller size and less power consumption.

BACKGROUND OF THE INVENTION

Reference current generator is applied in integrated circuits for supplying reference currents to analog circuits. FIG. 1 shows a circuit diagram of a conventional reference current generator 10, which comprises a resistor Rptat having a resistance proportional to the absolute temperature for a current Iptat1 to flow therethrough to produce a voltage drop ΔV thereacross, a current mirror 12 including a referent branch consisting of an NMOS transistor T4 to couple with the current Iptat1 and a mirror branch consisting of an NMOS transistor T3 for generating a current Iptat2 by mirroring the current Iptat1, a PMOS transistor T1 coupled between a supply voltage VDD and the transistor T3 and having its gate and drain coupled together, a PMOS transistor T2 coupled between the NMOS transistor T4 and the resistor Rptat and having its gate coupled to the gate of the PMOS T1, and an NMOS transistor T5 having its gate coupled to the gate of the NMOS transistor T4 for generating a current Idc_ld1 proportional to the current Iptat1 to supply for a load 14 coupled between the supply voltage VDD and the NMOS transistor T5. The PMOS transistors T1 and T2 have a size ratio 1:α, and the NMOS transistors T3, T4 and T5 have a size ratio β:1:γ. When the reference current generator 10 operates, a voltage drop VG is resulted between the source and drain of the PMOS transistor T1, the voltage drop ΔV is resulted across the resistor Rptat, the current Iptat1 flows from the PMOS transistor T2 to the NMOS transistor T4, and the current Iptat2 flows from the PMOS transistor T1 to the NMOS transistor T3.

FIG. 2 shows another conventional reference current generator 20, which has a structure similar to that of the reference current generator 10 of FIG. 1, but uses a PMOS transistor T5 connected between the supply voltage VDD and the load 14 instead, such that the current Idc_ld2 is produced to supply for the load 14. Additionally, the size ratio of the PMOS transistors T1, T2 and T5 is 1:α:γ, and the size ratio of the NMOS transistors T3 and T4 is β:1.

Referring to FIG. 1 and FIG. 2, due to the size ratio between the NMOS transistors T3 and T4, the currents Iptat1 and Iptat2 are determined by $$\text{Iptat2}=\beta\times\text{Iptat1}. \quad \text{[EQ-1]}$$

On the other hand, the currents Iptat1 and Iptat2 can be determined by $$Iptat1=\alpha\times I_{D0}\times e^{\left(\frac{VG}{n\times Vt}\right)}\times e^{\left(\div\frac{\Delta V}{Vt}\right)}, \quad \text{[EQ-2]}$$

and $$Iptat2=I_{D0}\times e^{\left(\frac{VG}{n\times Vt}\right)}, \quad \text{[EQ-3]}$$

where Vt is the thermal voltage. Substituting the equations EQ-2 and EQ-3 to the equation EQ-1, it is obtained $$\alpha\times\beta=e^{\frac{\Delta V}{Vt}}. \quad \text{[EQ-4]}$$

Further, the voltage drop ΔV across the resistor Rptat can be calculated by $$\Delta V=\text{Iptat1}\times\text{Rptat}. \quad \text{[EQ-5]}$$

Therefore, based on the equation EQ-4, the equation EQ-5 can be rewritten as $$Iptat1=\frac{Vt}{Rptat}\times\ln(\alpha\times\beta). \quad \text{[EQ-6]}$$

From the equation EQ-6, it is shown that the greater the resistance Rptat is, the less the current Iptat1 is, and hence, in order to reduce the power consumption by reducing the current Iptat1, the resistance Rptat must be increased. However, the occupying area of the resistor Rptat on a chip is also enlarged when the resistance Rptat is increased, and therefore the reference current generator 10 or 20 will have a larger chip size. Thereby, it is desired a reference current generator that has reduced chip size and less power consumption.

SUMMARY OF THE INVENTION

Accordingly, an object of the present invention is to provide a reference current generator having smaller chip size and less power consumption.

In a reference current generator, according to the present invention, a current mirror has a referent branch with a first current flowing thereon and a mirror branch to produce a second current by mirrorring the first current, a first transistor is coupled to the referent branch, a second transistor is coupled to the mirror branch and has a gate coupled to a gate of the first transistor, one or more third transistors each mirrors the first current or the second current to produce a reference current to supply for a load, and a resistor having a resistance proportional to the absolute temperature is coupled to the first transistor such that a third current equal to the summation of the first current and all the mirrored reference currents flows through the resistor.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
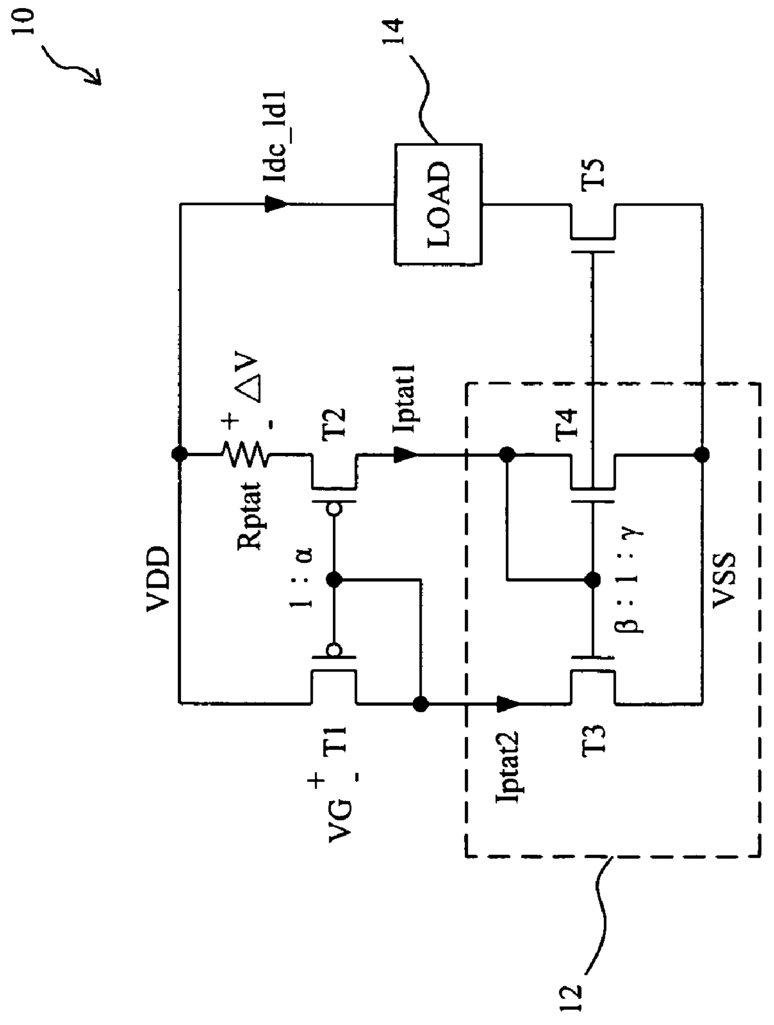
FIG. 1 PRIOR ART
FIG. 1 is a circuit diagram of a conventional reference current generator.
Figure 2:
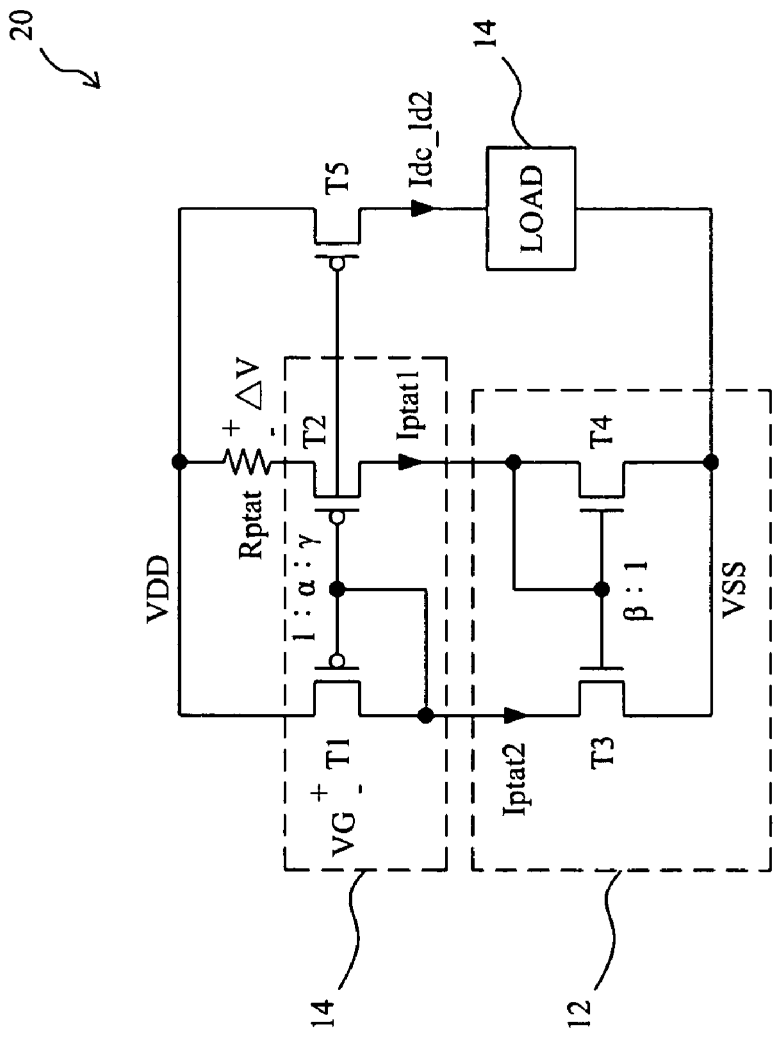
FIG. 2 PRIOR ART
FIG. 2 is a circuit diagram of another conventional reference current generator.
Figure 3:
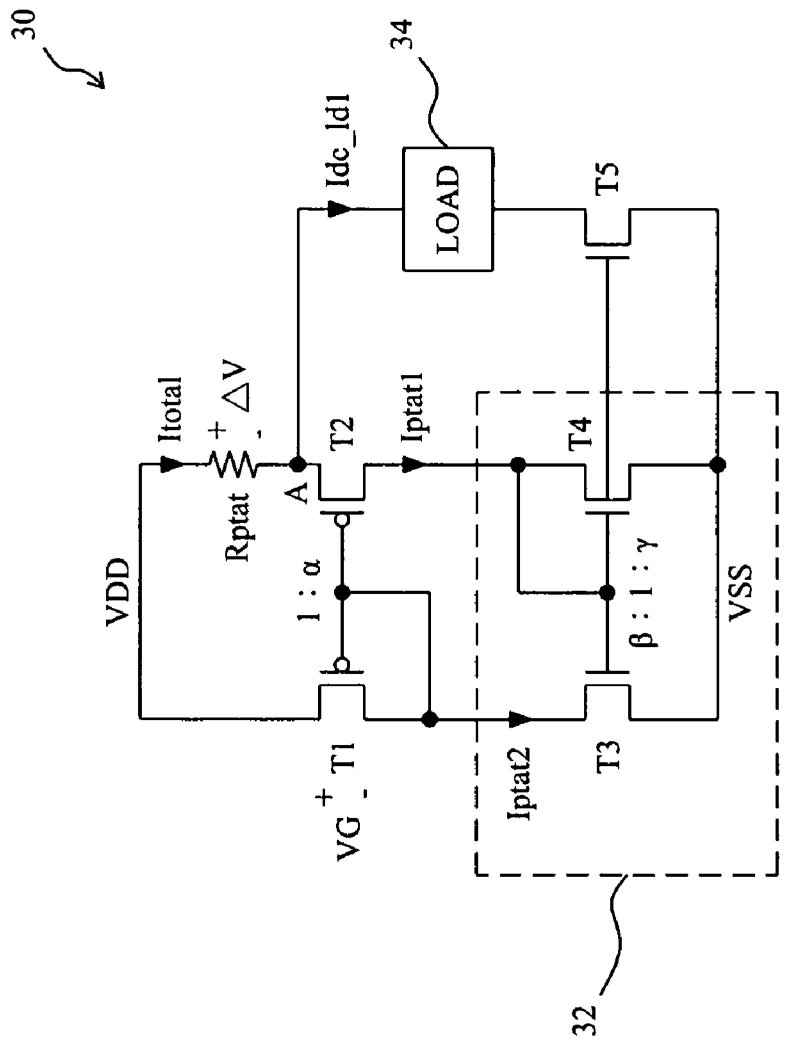
FIG. 3 is a circuit diagram of a reference current generator according to the present invention.

FIG. 3 is a circuit diagram of a reference current generator 30 according to the present invention, which comprises a resistor Rptat having a resistance proportional to the absolute temperature, a current mirror 32, two PMOS transistors T1 and T2, and an NMOS transistor T5 for producing a reference current Idc_1d1 supplied for a load 34.

The current mirror 32 includes a referent branch having an NMOS transistor T4 and a mirror branch having an NMOS transistor T3, and the NMOS transistor T4 has a gate connected to its source, a gate of the NMOS transistor T3 and a gate of the NMOS transistor T5. The PMOS transistor T1 is connected between a supply voltage VDD and the NMOS transistor T3, and has a gate and a drain connected together. The resistor Rptat is coupled between the supply voltage VDD and the PMOS transistor T2, and the latter is connected to the NMOS transistor T4. The load 34 is connected between the source of the PMOS transistor T2 and a drain of the NMOS transistor T5. In normal operation, the PMOS transistors T1 and T2 operate in weak inversion, and the NMOS transistors T3 and T4 operate in strong inversion, such that the current Idc_ld1 is produced to supply for the load 34. The current flows through the resistor Rptat is $$Itotal=Iptat1+Idc\_ld1. \quad \text{[EQ-7]}$$

In this embodiment, the size ratio of the PMOS transistors T1 and T2 is 1:α, and the size ratio of the NMOS transistors T3, T4 and T5 is β:1:γ.

Figure 4:
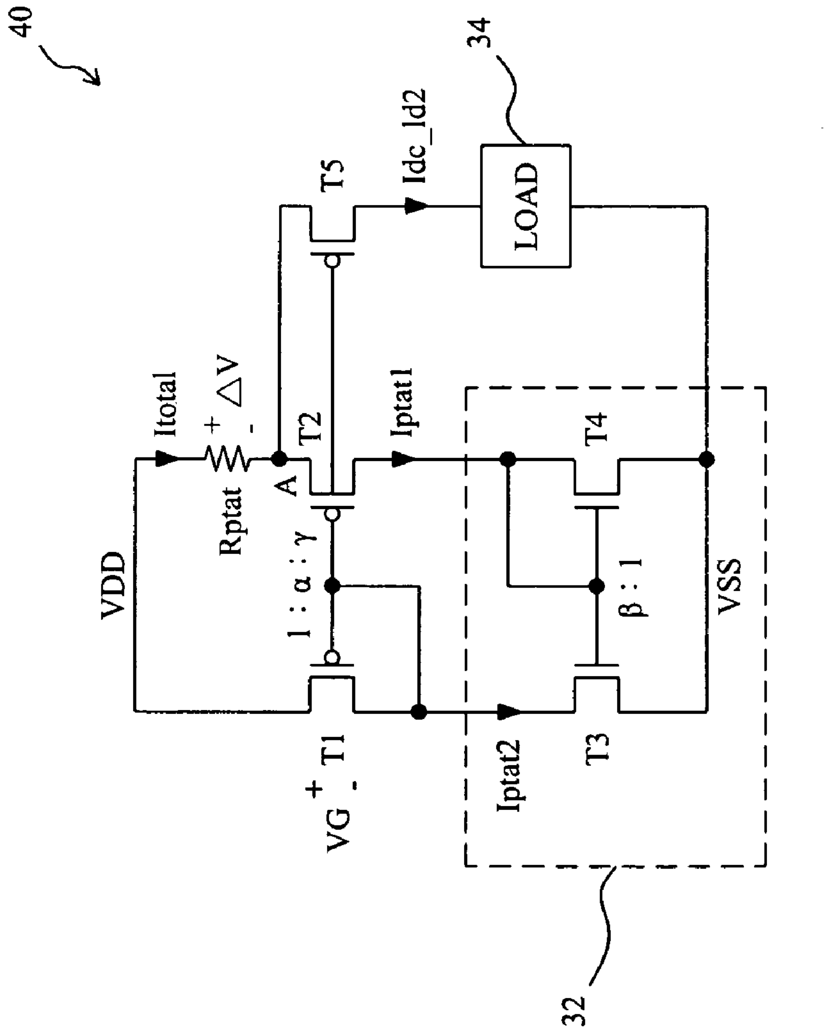
FIG. 4 is a circuit diagram of another reference current generator according to the present invention.

FIG. 4 is a circuit diagram of another embodiment according to the present invention. Similar to the reference current generator 30 of FIG. 3, the reference current generator 40 also comprises the resistor Rptat having a resistance proportional to the absolute temperature, the current mirror 32, and the PMOS transistors T1 and T2. However, in the reference current generator 40, a PMOS transistor T5 to produce a reference current Idc_ld2 to supply for the load 34 is common source and common gate to the PMOS transistor T2, and has its drain connected to the load 34. The current flows through the resistor Rptat is $$Itotal=Iptat1+Idc\_ld2. \quad \text{[EQ-8]}$$

In this embodiment, the size ratio of the PMOS transistors T1, T2 and T5 is 1:α:γ, and the size ratio of the NMOS transistors T3 and T4 is β:1.

In FIG. 3, due to the size ratio between the NMOS transistors T3 and T4, the currents Iptat1 and Iptat2 are determined by $$Iptat2=\beta\times Iptat1. \quad \text{[EQ-9]}$$

On the other hand, the currents Iptat1 and Iptat2 can be calculated by $$Iptat1=\alpha\times I_{D0}\times e^{\left(\frac{VG}{n\times Vt}\right)}\times e^{\left(\frac{\Delta V}{Vt}\right)}, \quad \text{[EQ-10]}$$

and $$Iptat2=I_{D0}\times e^{\left(\frac{VG}{n\,Vt}\right)}, \quad \text{[EQ-11]}$$

where Vt is the thermal voltage.

Substituting the equations EQ-10 and EQ-11 to the equation EQ-9, it is obtained $$\alpha\times\beta=e^{\frac{\Delta V}{Vt}}. \quad \text{[EQ-12]}$$

In addition, the voltage drop ΔV across the resistor Rptat can be determined by $$\Delta V=(Iptat1+Idc\_ld1)\times Rptat, \quad \text{[EQ-13]}$$

and due to the size ratio between the NMOS transistors T4 and T5, the reference current Idc_ldc1 can be determined by $$Idc\_ld1=\gamma\times Iptat1. \quad \text{[EQ-14]}$$

With the equations EQ-12 and EQ-14, the equation EQ-13 can be rewritten as $$Iptat1=\frac{Vt}{Rptat\times(1+y)}\times\ln(\alpha\times\beta)=\frac{1}{1+\gamma}\left[\frac{Vt}{Rptat}\times\ln(\alpha\times\beta)\right]. \quad \text{[EQ-15]}$$

When comparing the equation EQ-15 with the equation EQ-6 under the condition of the same α, β, and resistance Rptat, it is shown that the reference current generator 30 has the current Iptat1 equal to $$\frac{1}{(1+y)}$$

times less than that of the conventional reference current generator 10, or under the condition of the same α, β and current Iptat1, the reference current generator 30 has the resistance Rptat equal to $$\frac{1}{(1+y)}$$

times less than that of the conventional reference current generator 10.

For an example, if Iptat1=10 nA, Vt=26 mV, α=8, β=2, and γ=10, from the equation EQ-6, the resistance is $$Rptat=\frac{26\text{ mV}}{10\text{ nA}}\times\ln(8\times2)=7.2\,M\Omega, \quad \text{[EQ-16]}$$

while from the equation EQ-15, the resistance is $$Rptat=\frac{26\text{ mV}}{10\text{ nA}\times(1+10)}\times\ln(8\times2)=655\,k\Omega, \quad \text{[EQ-17]}$$

Obviously, the resistance Rptat of the reference current generator 30 is much smaller than that of the reference current generator 10. Thus, as mentioned above, the reference current generator 30 of the present invention will occupy less chip area than the conventional one 10. Similarly, under the same condition, the resistance Rptat of the reference current generator 40 is also much smaller than that of the reference current generator 20.

Furthermore, when operating under the condition of the same resistance Rptat and voltage drop ΔV, from the equations EQ-5, EQ-13 and EQ-14, it is shown that the reference current generator 30 has the current Ipata1 equal to $$\frac{1}{(1+\gamma)}$$

times less than that of the conventional generator 10, thereby reducing the power consumption dramatically. Similarly, the power consumption of the reference current generator 40 is also much less than that of the conventional one 20.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A reference current generator comprising:

a current mirror having a referent branch with a first current flowing thereon and a mirror branch to produce a second current by mirroring the first current;

a first transistor coupled to the referent branch;

a second transistor coupled to the mirror branch, having a gate coupled to a gate of the first transistor;

at least a third transistor, each for producing a reference current by mirroring the first current or the second current to supply for a load; and a resistor having a resistance proportional to the absolute temperature, coupled to the first transistor such that a third current equal to the summation of the first current and all the mirrored reference currents flows through the resistor.

2. The reference current generator of claim 1, wherein the first current is inversely proportional to the resistance.

3. The reference current generator of claim 1, wherein the first current is proportional to absolute temperature.

* * * * *